United States Patent
Sun (10) Patent No.: US 9,484,361 B2
(45) Date of Patent: Nov. 1, 2016

(54) ARRAY SUBSTRATE, MANUFACTURING METHOD THEREOF, DISPLAY PANEL AND DISPLAY DEVICE

(71) Applicant: BOE TECHNOLOGY GROUP CO., LTD., Beijing (CN)

(72) Inventor: Liang Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/804,841

(22) Filed: Jul. 21, 2015

(65) Prior Publication Data

US 2016/0197102 A1 Jul. 7, 2016

(30) Foreign Application Priority Data

Jan. 4, 2015 (CN) .......................... 2015 1 0002315

(51) Int. Cl.
*H01L 27/12* (2006.01)
*H01L 29/786* (2006.01)
*H01L 29/66* (2006.01)
*H01L 21/02* (2006.01)

(52) U.S. Cl.
CPC ..... *H01L 27/1222* (2013.01); *H01L 21/02532* (2013.01); *H01L 21/02592* (2013.01); *H01L 21/02675* (2013.01); *H01L 27/1218* (2013.01); *H01L 27/1288* (2013.01); *H01L 29/6675* (2013.01); *H01L 29/78672* (2013.01)

(58) Field of Classification Search
None
See application file for complete search history.

(56) References Cited

U.S. PATENT DOCUMENTS 6,710,926 B2 * 3/2004 Beach .................... G02B 3/005
359/619

* cited by examiner

*Primary Examiner* — Armando Rodriguez
(74) *Attorney, Agent, or Firm* — Harness, Dickey & Pierce, P.L.C.

(57) ABSTRACT

The present disclosure provides an array substrate, a manufacturing method thereof, a display panel and a display device. A base substrate of the array substrate or a buffer layer on the base substrate is provided with a plurality of recessed sections, each recessed section is provided with at least one inclined surface, and a thin film transistor (TFT) is arranged at the inclined surface of each recessed section. The recessed sections are divided into at least two types. In the recessed sections of different types, angles between a horizontal surface of the array substrate and the inclined surfaces on which the TFTs are arranged are different from each other.

20 Claims, 3 Drawing Sheets

ARRAY SUBSTRATE, MANUFACTURING METHOD THEREOF, DISPLAY PANEL AND DISPLAY DEVICE

CROSS-REFERENCE TO RELATED APPLICATION

The present application claims a priority of the Chinese patent application No. 201510002315.4 filed on Jan. 4, 2015, which is incorporated herein by reference in its entirety.

TECHNICAL FIELD

The present disclosure relates to the field of display technology, in particular to an array substrate, a manufacturing method thereof, a display panel and a display device.

BACKGROUND

For a flat display panel such as a liquid crystal display (LCD) panel or an organic light-emitting diode (OLED) display panel, a thin film transistor (TFT) on an array substrate may serve as a switching TFT or a driving TFT.

In the flat display panel, there are different requirements on the characteristics of the switching TFT and the driving TFT. To be specific, it is required for the switching TFT to have a large on-state current so as to ensure its high switching performance, and it is required for the driving TFT to have a small on-state current so as to ensure its low-current driving performance.

Currently, an active layer of the TFT is usually made of poly-Si formed by subjecting a-Si to excimer laser annealing treatment, and mobility of carriers in the poly-Si is greater than that in a-Si. The mobility of the carriers in the poly-Si depends on a grain size, and the on-state current of the TFT depends on the mobility of the carriers. In other words, the larger the grain size of the poly-Si, the greater the mobility of the carriers and the larger the on-state current of the TFT. Hence, when manufacturing the switching TFT and the driving TFT on an identical array substrate simultaneously, it is required to control the grain sizes of the poly-Si for the switching TFT and the driving TFT, respectively, so as to meet different requirements of the switching TFT and the driving TFT on the on-state currents. However, with respect to TFTs of different types on the same array substrate, it is impossible for an existing excimer laser annealing process to form poly-Si with different grain sizes through crystallization in different degrees.

Hence, there exists such an urgent need to achieve the crystallization in different degrees through the excimer laser annealing process with respect to TFTs of different types on the same array substrate.

SUMMARY

An object of the present disclosure provides an array substrate, a manufacturing method thereof, a display panel and a display device, so as to achieve crystallization in different degrees through an excimer laser annealing process with respect to TFTs of different types on an identical array substrate.

In one aspect, the present disclosure provides in one embodiment an array substrate, including a plurality of TFTs and a plurality of recessed sections. Each recessed section is provided with at least one inclined surface, and one of the TFTs is arranged at the inclined surface of each recessed section. The recessed sections are divided into at least two types. In the recessed sections of different types, angles between a horizontal surface of the array substrate and the inclined surfaces on which the TFTs are arranged are different from each other. An active layer of each TFT is a poly-Si film formed by subjecting an a-Si film to excimer laser annealing treatment.

According to the array substrate in the embodiments of the present disclosure, the array substrate includes a plurality of recessed sections, each recessed section is provided with at least one inclined surface, and one of the TFTs is arranged at the inclined surface of each recessed section. The recessed sections are divided into at least two types; in the recessed sections of different types, angles between a horizontal surface of the array substrate and the inclined surfaces on which the TFTs are arranged are different from each other. In this way, during the manufacture of the active layer of each TFT, when the a-Si film at each recessed section is subjected to the excimer laser annealing treatment so as to melt and crystallize the a-Si film into the poly-Si film, different laser energy levels are received by the a-Si films at the recessed sections of different types, and the grain sizes of the poly-Si films formed at these recessed sections of different types are different from each other. As a result, it is able to achieve the crystallization in different degrees through an excimer laser annealing process with respect to the TFTs of different types on an identical array substrate.

Further, the array substrate includes a base substrate, the plurality of recessed sections is formed in the base substrate, and the horizontal surface of the array substrate is a horizontal surface of the base substrate.

Further, the array substrate includes a base substrate and a buffer layer arranged on the base substrate, the plurality of recessed sections is formed in the buffer layer, and the horizontal surface of the array substrate is a horizontal surface of the base substrate.

Further, the buffer layer is made of a photosensitive material.

Further, the recessed sections are divided into two types including first recessed sections and second recessed sections; an angle between the inclined surface of the first recessed section on which the TFT is arranged and the horizontal surface of the array substrate is greater than an angle between the inclined surface of the second recessed section on which the TFT is arranged and the horizontal surface of the array substrate, the TFT arranged within the first recessed section is a driving TFT, and the TFT arranged within the second recessed section is a switching TFT.

Further, the angle between each of the inclined surfaces of the recessed sections on which the TFTs are arranged and the horizontal surface of the array substrate is greater than 0° and less than 80°.

Further, each recessed section is of a depth less than 50 μm.

In another aspect, the present disclosure provides in one embodiment a method for manufacturing an array substrate, including steps of:

forming a pattern including a plurality of recessed sections in a base substrate by a patterning process, each recessed section being provided with at least one inclined surface; and forming a pattern including a TFT on the inclined surface of each recessed section; the recessed sections being divided into at least two types; in the recessed sections of different types, angles between a horizontal surface of the base substrate and the inclined surfaces on which the TFTs are arranged being different from each other.

According to the method in the embodiments of the present disclosure, the recessed sections are formed in a surface of the base substrate, each recessed section is provided with at least one inclined surface, and the TFT is arranged at the inclined surface of each recessed section. The recessed sections are divided into at least two types; in the recessed sections of different types, angles between the horizontal surface of the base substrate and the inclined surfaces on which the TFTs are arranged are different from each other. In this way, during the manufacture of an active layer of each TFT, when an a-Si film at each recessed section is subjected to excimer laser annealing treatment so as to melt and crystallize the a-Si film into a poly-Si film, different laser energy levels are received by the a-Si films at the recessed sections of different types, and the grain sizes of the poly-Si films formed at these recessed sections of different types are different from each other. As a result, it is able to achieve the crystallization in different degrees through an excimer laser annealing process with respect to the TFTs of different types on an identical array substrate.

Further, the recessed sections are divided into two types including first recessed sections and second recessed sections, and an angle between the inclined surface of the first recessed section on which the TFT is arranged and the horizontal surface of the base substrate is greater than an angle between the inclined surface of the second recessed section on which the TFT is arranged and the horizontal surface of the base substrate.

The step of forming the pattern including the TFT on the inclined surface of each recessed section includes: forming a pattern including a driving TFT on the inclined surface of each first recessed section, and forming a pattern including a switching TFT on the inclined surface of each second recessed section.

Further, the step of forming the pattern including the TFT on the inclined surface of each recessed section includes forming an active layer of each TFT.

The step of forming the active layer of each TFT includes: forming an a-Si film at each recessed section, and irradiating a laser beam from an excimer laser in a direction perpendicular to the horizontal surface of the base substrate onto the a-Si film at each recessed section to melt and crystallize the a-Si film into a poly-Si film.

Further, the angle between the horizontal surface of the base substrate and each of the inclined surfaces of the recessed sections on which the TFTs are arranged is greater than 0° and less than 80°.

Further, each recessed section is of a depth less than 50 μm.

In yet another aspect, the present disclosure provides in one embodiment a method for manufacturing an array substrate, including steps of:

forming a buffer layer on a base substrate;

forming a pattern including a plurality of recessed sections in the buffer layer by a patterning process, each recessed section being provided with at least one inclined surface; and forming a pattern including a TFT on the inclined surface of each recessed section, the recessed sections being divided into at least two types; in the recessed sections of different types, angles between a horizontal surface of the base substrate and the inclined surfaces on which the TFTs are arranged being different from each other.

According to the method in the embodiments of the present disclosure, the recessed sections are formed in a surface of the buffer layer of the base substrate, each recessed section is provided with at least one inclined surface, and the TFT is arranged at the inclined surface of each recessed section. The recessed sections are divided into at least two types; in the recessed sections of different types, angles between the horizontal surface of the base substrate and the inclined surfaces on which the TFTs are arranged are different from each other. In this way, during the manufacture of an active layer of each TFT, when an a-Si film at the each recessed section is subjected to excimer laser annealing treatment so as to melt and crystallize the a-Si film into a poly-Si film, different laser energy levels are received by the a-Si films at the recessed sections of different types, and the grain sizes of the poly-Si films formed at these recessed sections of different types are different from each other. As a result, it is able to achieve the crystallization in different degrees through an excimer laser annealing process with respect to the TFTs of different types on an identical array substrate.

Further, the recessed sections are divided into two types including first recessed sections and second recessed sections, and an angle between the inclined surface of each first recessed section on which the TFT is arranged and the horizontal surface of the base substrate is greater than an angle between the inclined surface of each second recessed section on which the TFT is arranged and the horizontal surface of the base substrate.

The step of forming the pattern including the TFT on the inclined surface of each recessed section includes forming a pattern including a driving TFT on the inclined surface of each first recessed section, and forming a pattern including a switching TFT on the inclined surface of each second recessed section.

Further, the step of forming the pattern including the recessed sections in the buffer layer by a patterning process includes exposing the buffer layer using a half-tone or gray-tone mask plate, and developing the exposed buffer layer to form the pattern including the recessed sections.

In still yet another aspect, the present disclosure provides in one embodiment a display panel including the above-mentioned array substrate.

In still yet another aspect, the present disclosure provides in one embodiment a display device including the above-mentioned display panel.

DETAILED DESCRIPTION

The present disclosure will be described hereinafter in conjunction with the drawings and embodiments. A shape and a thickness of each layer in the drawings are for illustrative purposes only, but shall not be used to reflect an actual scale of the array substrate.

Figure 1:
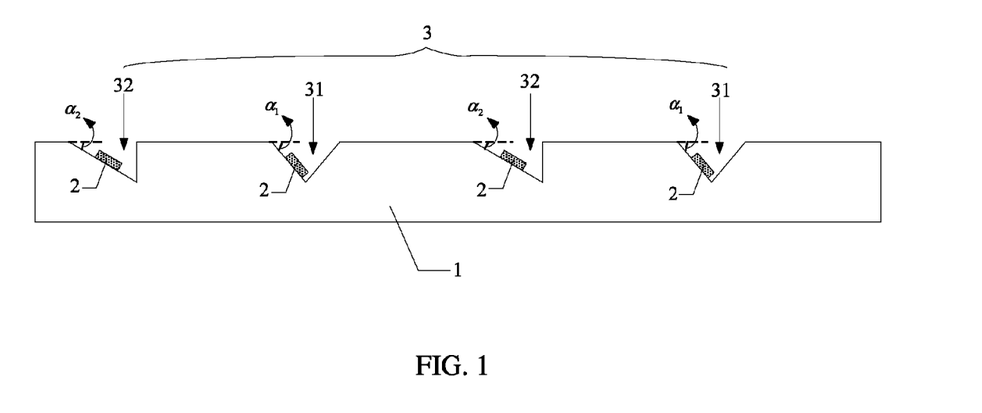
FIG. 1 is a schematic view showing an array substrate according to one embodiment of the present disclosure.

As shown in FIG. 1, the present disclosure provides in one embodiment an array substrate, which includes a base substrate 1 and a plurality of TFTs 2 arranged in the base substrate 1. An active layer of each TFT 2 is a poly-Si film formed by subjecting an a-Si film to excimer laser annealing treatment.

The base substrate 1 includes a plurality of recessed sections 3 (as an example, four recessed sections are shown in FIG. 1). Each recessed section 3 is provided with at least one inclined surface, and one TFT 2 is arranged on the inclined surface of each recessed section 3. The recessed sections 3 can be divided into at least two types. In the recessed sections 3 of different types, angles between the inclined surfaces on which the TFTs 2 are arranged and a surface of the base substrate 1, e.g., a horizontal surface (when the array substrate is arranged at a position shown in FIG. 1), are different from each other.

According to the array substrate in the embodiments of the present disclosure, the base substrate includes a the plurality of recessed sections, each recessed section is provided with at least one inclined surface, and one of the TFTs is arranged at the inclined surface of each recessed section. The recessed sections can be divided into at least two types. In the recessed sections of different types, the angles between the horizontal surface of the array substrate and the inclined surfaces on which the TFTs are arranged are different from each other. In this way, during the manufacture of the active layer of each TFT, when the a-Si film at the each recessed section is subjected to the excimer laser annealing treatment so as to melt and crystallize the a-Si film into the poly-Si film, different laser energy levels are received by the a-Si films at the recessed sections of different types, so that the grain sizes of the poly-Si films formed at the recessed sections of different types are different from each other. As a result, it is able to achieve the crystallization in different degrees through the excimer laser annealing process with respect to the TFTs of different types on an identical array substrate, enable the mobility of carriers in the active layers of the TFTs of different types to be different from each other and provide these TFTs of different types with different on-state currents, thereby to meet different requirements of these TFTs of different types on the identical array substrate on the on-state currents.

During the implementation, in the above array substrate of the embodiments of the present disclosure, the angle between the inclined surface of each recessed section on which the TFT is generally arranged and the horizontal surface of the base substrate is greater than 0° and less than 80°, and each recessed section is of a depth less than 50 μm.

Figure 2:
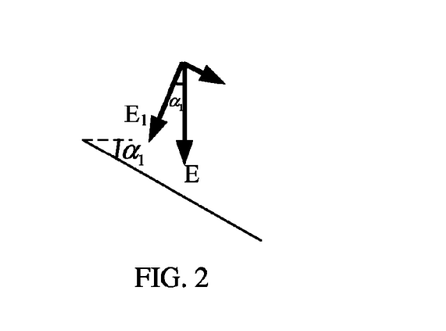
FIG. 2 is a schematic view showing a principle that laser energy is received by a TFT within a first recessed section of the array substrate according to one embodiment of the present disclosure.

During the implementation, in the above array substrate of the embodiments of the present disclosure, as shown in FIG. 1, the recessed sections 3 may be divided into two types including first recessed sections 31 and second recessed sections 32. An angle $\alpha_1$ between the inclined surface of each first recessed section 31 on which the TFT 2 is arranged and the horizontal surface of the base substrate 1 is greater than an angle $\alpha_2$ between the inclined surface of each second recessed section 32 on which the TFT 2 is arranged and the horizontal surface of the base substrate 1. During the manufacture of the active layer of each TFT 2, when the a-Si film at each recessed section 3 is subjected to the excimer laser annealing treatment so as to melt and crystallize the a-Si film into the poly-Si film, a laser beam with an energy level E is emitted by the excimer laser in a direction substantially perpendicular to the horizontal surface of the base substrate 1, and a laser energy level $E_1$ received by the a-Si film at the first recessed section 31 is a component E cos $\alpha_2$ of the laser energy level E in a direction perpendicular to the inclined surface of the first recessed section 31 on which the TFT 2 is arranged (as shown in FIG. 2). Similarly, a laser energy level $E_2$ received by the a-Si film at the second recessed section 32 is a component E cos $\alpha_2$ of the laser energy level E in a direction perpendicular to the inclined surface of the second recessed section 32 on which the TFT 2 is arranged. $\alpha_1 > \alpha_2$, so E cos $\alpha_1 <$ E cos $\alpha_2$, i.e., the laser energy level $E_1$ received by the a-Si film at the first recessed section 31 is less than the laser energy level $E_2$ received by the a-Si film at the second recessed section 32. In this way, a grain size of the poly-Si film formed at the first recessed section 31 is less than that of the poly-Si film formed at the second recessed section 32. The mobility of the carriers in the poly-Si film at the first recessed section 31 is less than that at the second recessed section 32. The on-state current for the TFT at the first recessed section 31 is less than that at the second recessed section 32. As a result, the TFT formed at the first recessed section can be used as a driving TFT, and the TFT formed at the second recessed section can be used as a switching TFT.

It should be appreciated that, the above-mentioned array substrate is adapted to a flat display panel such as an LCD panel or an OLED display panel.

Figure 3:
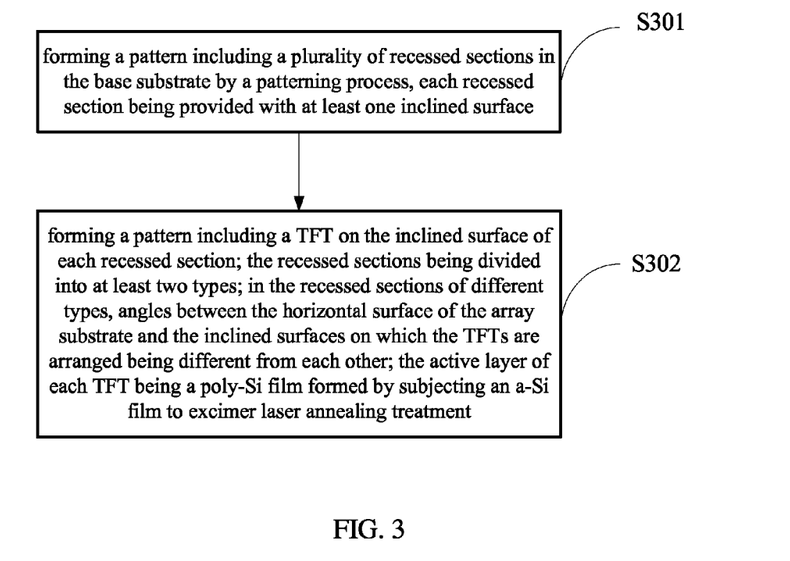
FIG. 3 is a flow chart of a method for manufacturing the array substrate according to one embodiment of the present disclosure.

Based on an identical inventive concept, the present disclosure further provides in one embodiment a method for manufacturing the array substrate. As shown in FIG. 3, the method includes steps of:

S301: forming a pattern including a plurality of recessed sections in the base substrate by a patterning process, each recessed section being provided with at least one inclined surface; and S302: forming a pattern including a TFT on the inclined surface of each recessed section; the recessed sections being divided into at least two types; in the recessed sections of different types, angles between the horizontal surface of the array substrate and the inclined surfaces on which the TFTs are arranged being different from each other; the active layer of each TFT being a poly-Si film formed by subjecting an a-Si film to excimer laser annealing treatment.

According to the method in the embodiments of the present disclosure, the base substrate includes a plurality of recessed sections defined in a surface of the base substrate, each recessed section is provided with at least one inclined surface, and one of the TFTs is arranged at the inclined surface of each recessed section. The recessed sections can be divided into at least two types; in the recessed sections of different types, the angles between the inclined surfaces on which the TFTs are arranged and the horizontal surface of the array substrate are different from each other. In this way, during the manufacture of the active layer of each TFT, when the a-Si film at the each recessed section is subjected to the excimer laser annealing treatment so as to melt and crystallize the a-Si film into the poly-Si film, different laser energy levels are received by the a-Si films at the recessed sections of different types, and the grain sizes of the poly-Si films formed at these recessed sections of different types are different from each other. As a result, it is able to achieve the crystallization in different degrees through the excimer laser annealing process with respect to the TFTs of different types on an identical array substrate, enable the mobility of carriers in the active layers of the TFTs of different types to be different from each other and provide these TFTs of different types with different on-state currents, thereby to meet different requirements of these TFTs of different types on the identical array substrate on the on-state currents.

During the implementation, forming a pattern including a plurality of recessed sections in the base substrate by a patterning process in step S301 can be implemented through following manners. First, a photoresist layer is applied onto the base substrate and then exposed and developed, so as to form a photoresist reserved region and a photoresist unreserved region. Next, the photoresist unreserved region is etched, and finally the remaining photoresist is removed, so as to form the pattern including a plurality of recessed sections. To be specific, when etching the base substrate, it is able to control a lateral etching rate and a longitudinal etching rate, thereby to enable the angle between the inclined surface of the recessed section of one type and the horizontal surface of the base substrate to be different from the angle between the inclined surface of the recessed section of another different type and the horizontal surface of the base substrate.

During the implementation, the recessed sections can be divided into two types including first recessed sections and second recessed sections. When an angle between the inclined surface of each first recessed section on which the TFT is arranged and the horizontal surface of the base substrate is greater than an angle between the inclined surface of each second recessed section on which the TFT is arranged and the horizontal surface of the base substrate, a laser energy level received by the a-Si film at the first recessed section is less than that received by the a-Si film at the second recessed section. In this way, a grain size of the poly-Si film formed at the first recessed section is less than that of the poly-Si film formed at the second recessed section. The mobility of the carriers in the poly-Si film at the first recessed section is less than that at the second recessed section, and the on-state current for the TFT at the first recessed section is less than that at the second recessed section. Hence, the forming a pattern including a TFT on the inclined surface of each recessed section in step S302 can be implemented in follow manner: forming a pattern including a driving TFT on the inclined surface of each first recessed section, and forming a pattern including a switching TFT on the inclined surface of each second recessed section.

It should be appreciated that, the array substrate manufactured by the above-mentioned method may be adapted to a flat display panel such as an LCD panel or an OLED display panel.

Figure 4:
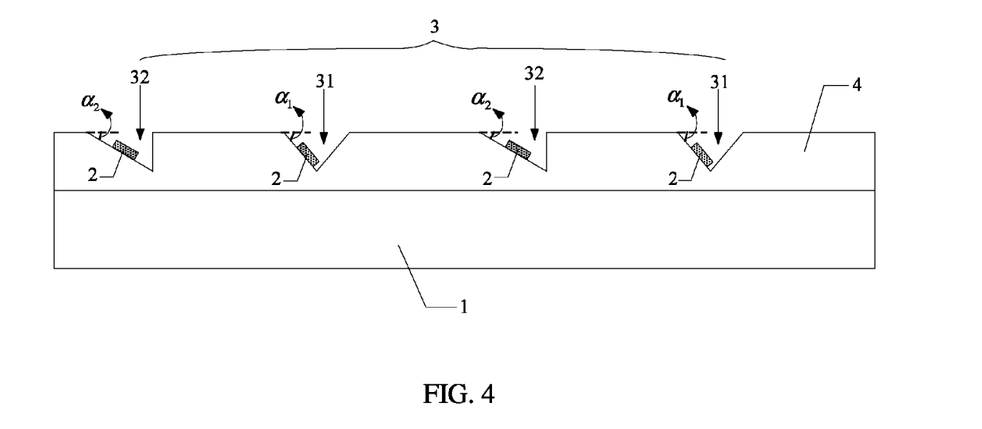
FIG. 4 is a schematic view showing an array substrate according to another embodiment of the present disclosure.

Based on an identical inventive concept, the present disclosure further provides in one embodiment an array substrate. As shown in FIG. 4, the array substrate includes a base substrate 1, a buffer layer 4 arranged on the base substrate 1, and a plurality of TFTs 2 arranged in the buffer layer 4. An active layer of each TFT 2 is a poly-Si film formed by subjecting an a-Si film to excimer laser annealing treatment.

The buffer layer 4 is provided with a plurality of recessed sections 3 (as an example, four recessed sections are shown in FIG. 4), each recessed section 3 is provided with at least one inclined surface, and one TFT 2 is arranged on the inclined surface of each recessed section 3. The recessed sections 3 can be divided into at least two types; in the recessed sections 3 of different types, angles between a horizontal surface of the base substrate 1 and the inclined surfaces on which the TFTs 2 are arranged are different from each other.

According to the array substrate in the embodiments of the present disclosure, the buffer layer of the base substrate is provided with a plurality of recessed sections, each recessed section is provided with at least one inclined surface, and one of the TFTs is arranged at the inclined surface of each recessed section. The recessed sections can be divided into at least two types. In the recessed sections of different types, the angles between the horizontal surface of the array substrate and the inclined surfaces on which the TFTs are arranged are different from each other. In this way, during the manufacture of the active layer of each TFT, when the a-Si film at each recessed section is subjected to the excimer laser annealing treatment so as to melt and crystallize the a-Si film into the poly-Si film, different laser energy levels are received by the a-Si films at the recessed sections of different types, and the grain sizes of the poly-Si films formed at these recessed sections of different types are different from each other. As a result, it is able to achieve the crystallization in different degrees through the excimer laser annealing process with respect to the TFTs of different types on an identical array substrate, enable the mobility of carriers in the active layers of the TFTs of different types to be different from each other and provide these TFTs of different types with different on-state currents, thereby to meet different requirements of these TFTs of different types on the identical array substrate on the on-state currents.

During the implementation, in the above array substrate of the embodiments of the present disclosure, the angle between the inclined surface of each recessed section on which the TFT is arranged and the horizontal surface of the base substrate is greater than 0° and less than 80°, and each recessed section is of a depth less than 50 μm.

During the implementation, in the above array substrate of the embodiments of the present disclosure, as shown in FIG. 4, the recessed sections 3 may be divided into two types including first recessed sections 31 and second recessed sections 32. An angle $\alpha_1$ between the inclined surface of each first recessed section 31 on which the TFT 2 is arranged and the horizontal surface of the base substrate 1 is greater than an angle $\alpha_2$ between the inclined surface of each second recessed section 32 on which the TFT 2 is arranged and the horizontal surface of the base substrate 1. During the manufacture of the active layer of the TFT 2, when the a-Si film at each recessed section 3 is subjected to the excimer laser annealing treatment so as to melt and crystallize the a-Si film into the poly-Si film, a laser beam with an energy level E is emitted by the excimer laser in a direction substantially perpendicular to the horizontal surface of the base substrate 1, and a laser energy level $E_1$ received by the a-Si film at the first recessed section 31 is a component $E \cos \alpha_1$ of the laser energy level L in a direction perpendicular to the inclined surface of the first recessed section 31 on which the TFT 2 is arranged (as shown in FIG. 2). Similarly, a laser energy level $E_2$ received by the a-Si film at the second recessed section 32 is a component $E \cos \alpha_2$ of the laser energy level E in a direction perpendicular to the inclined surface of the second recessed section 32 on which the TFT 2 is arranged. $\alpha_1 > \alpha_2$, so $E \cos \alpha_1 < E \cos \alpha_2$, i.e., the laser energy lever received by the a-Si film at the first recessed section 31 is less than the laser energy level received by the a-Si film at the second recessed section 32. In this way, a grain size of the poly-Si film formed at the first recessed section 31 is less than that of the poly-Si film formed at the second recessed section 32. The mobility of the carriers in the poly-Si film at the first recessed section 31 is less than that at the second recessed section 32. The on-state current for the TFT at the first recessed section 31 is less than that at the second recessed section 32. As a result, the TFT formed at the first recessed section can be used as a driving TFT, and the TFT formed at the second recessed section can be used as a switching TFT.

During the implementation, the buffer layer may be made of a photosensitive material, e.g., a spin-on glass (SOG) material. In this way, when forming a pattern including the recessed sections in the buffer layer by a patterning process, it is unnecessary to apply a photoresist layer onto the buffer layer, and instead, the photosensitive material may be directly exposed and developed so as to form the pattern including the recessed sections. In addition, the entire manufacturing process of the array substrate can be simplified due to the absence of the etching and removing processes, thereby to reduce the production cost of the array substrate.

Of course, the buffer layer may also be made of any other materials, as long as the pattern including the recessed sections may be formed in the buffer layer by an existing patterning process.

It should be appreciated that, the above-mentioned array substrate may be adapted to a flat display panel such as an LCD panel or an OLED display panel.

Figure 5:
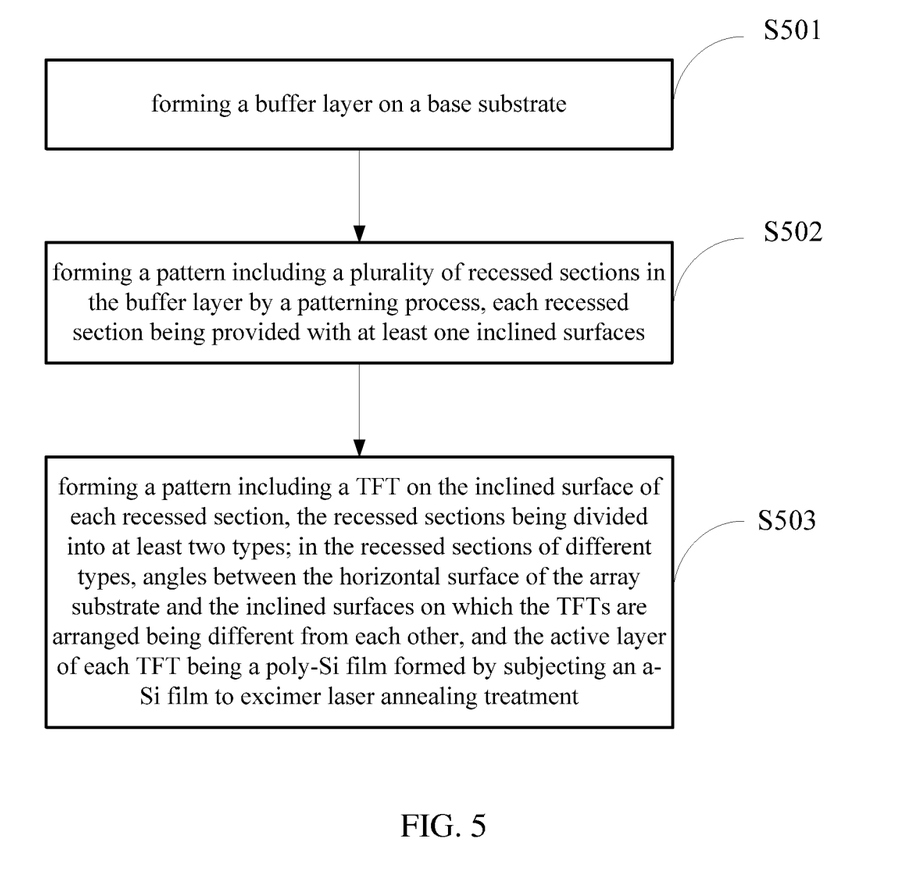
FIG. 5 is a flow chart of a method for manufacturing the array substrate according to another embodiment of the present disclosure.

Based on an identical inventive concept, the present disclosure further provides in one embodiment a method for manufacturing the array substrate. As shown in FIG. 5, the method includes steps of:

S501: forming a buffer layer on a base substrate;

S502: forming a pattern including a plurality of recessed sections in the buffer layer by a patterning process, each recessed section being provided with at least one inclined surfaces; and S503: forming a pattern including a TFT on the inclined surface of each recessed section, the recessed sections being divided into at least two types; in the recessed sections of different types, angles between the horizontal surface of the array substrate and the inclined surfaces on which the TFTs are arranged being different from each other, and the active layer of each TFT being a poly-Si film formed by subjecting an a-Si film to excimer laser annealing treatment.

According to the method in the embodiments of the present disclosure, the buffer layer of the base substrate is provided with a plurality of recessed sections, each recessed section is provided with at least one inclined surface, and one of the TFTs is arranged at the inclined surface of each recessed section. The recessed sections can be divided into at least two types. In the recessed sections of different types, the angles between the inclined surfaces on which the TFTs are arranged and the horizontal surface of the array substrate are different from each other. In this way, during the manufacture of the active layer of each TFT, when the a-Si film at the each recessed section is subjected to the excimer laser annealing treatment so as to melt and crystallize the a-Si film into the poly-Si film, different laser energy levels are received by the a-Si films at the recessed sections of different types, and the grain sizes of the poly-Si films formed at these recessed sections of different types are different from each other. As a result, it is able to achieve the crystallization in different degrees through the excimer laser annealing process with respect to the TFTs of different types on an identical array substrate, enable the mobility of carriers in the active layers of the TFTs of different types to be different from each other and provide these TFTs of different types with different on-state currents, thereby to meet different requirements of these TFTs of different types on the identical array substrate on the on-state currents.

During the implementation, the recessed sections can be divided into two types including first recessed sections and second recessed sections. When an angle between the inclined surface of each first recessed section on which the TFT is arranged and the horizontal surface of the base substrate is greater than an angle between the inclined surface of each second recessed section on which the TFT is arranged and the horizontal surface of the base substrate, a laser energy level received by the a-Si film at the first recessed section is less than that received by the a-Si film at the second recessed section. In this way, a grain size of the poly-Si film formed at the first recessed section is less than that of the poly-Si film formed at the second recessed section 2. The mobility of the carriers in the poly-Si film at the first recessed section is less than that at the second recessed section, and the on-state current for the TFT at the first recessed section is less than that at the second recessed section. Hence, the forming a pattern including a TFT on the inclined surface of each recessed section in step S503 can be implemented in follow manner: forming a pattern including a driving TFT on the inclined surface of each first recessed section, and forming a pattern including a switching TFT on the inclined surface of each second recessed section.

During the implementation, when the buffer layer is made of a photosensitive material, e.g., a SOG material, the forming a pattern including a plurality of recessed sections in the buffer layer by a patterning process in the step S502 can be implemented in follow manner: first, exposing the buffer layer using a half-tone or gray-tone mask plate, and developing the exposed buffer layer to form the pattern including the recessed sections. In this way, when forming the pattern including the recessed sections in the buffer layer by a patterning process, it is unnecessary to apply a photoresist layer onto the buffer layer, and instead, the photosensitive material may be directly exposed and developed so as to form the pattern including the recessed sections. In addition, the entire manufacturing process of the array substrate can be simplified due to the absence of the etching and removing processes, thereby to reduce the production cost thereof. In addition, through the half-tone or gray-tone mask plate, it is able to enable the angle between the inclined surface of the recessed section of one type and the horizontal surface of the base substrate to be different from the angle between the inclined surface of the recessed section of another different type and the horizontal surface of the base substrate.

Of course, the buffer layer may also be made of any other materials, as long as the pattern including the recessed sections may be formed in the buffer layer by an existing patterning process.

It should be appreciated that, the array substrate manufactured by the above-mentioned method may be adapted to a flat display panel such as an LCD panel or an OLED display panel.

Based on an identical inventive concept, the present disclosure further provides in one embodiment a display panel including the above-mentioned array substrate. The display panel may be a flat display pane such as an LCD panel or an OELD display panel. The implementation of the display panel may refer to the implementation of the above array substrate, which thus will not be repeated herein.

Based on an identical inventive concept, the present disclosure provides in one embodiment a display device including the above-mentioned display panel. The display device may be any product or component having a display function, such as a mobile phone, a flat-panel PC, a TV, a display, a laptop PC, a digital photo frame or a navigator. The implementation of the display device may refer to the implementation of the above display panel, which thus will not be repeated herein.

According to the array substrate, its manufacturing method, the display panel and the display device in the embodiments of the present disclosure, the base substrate is provided with a plurality of recessed sections, or the buffer layer of the base substrate is provided with a plurality of recessed sections; each recessed section is provided with at least one inclined surface, and the TFT is arranged at the inclined surface of each recessed section. The recessed sections can be divided into at least two types; in the recessed sections of different types, the angles between the inclined surfaces on which the TFTs are arranged and the horizontal surface of the array substrate are different from each other. In this way, during the manufacture of an active layer of each TFT, when an a-Si film at each recessed section is subjected to the excimer laser annealing treatment so as to melt and crystallize the a-Si film into a poly-Si film, different laser energy levels are received by the a-Si films at the recessed sections of different types, and the grain sizes of the poly-Si films formed at these recessed sections of different types are different from each other. As a result, it is able to achieve the crystallization in different degrees through the excimer laser annealing process with respect to the TFTs of different types on an identical array substrate.

The above are merely the preferred embodiments of the present disclosure. A person skilled in the art may make further modifications and improvements without departing from the spirit of the present disclosure, and these modifications and improvements shall also fall within the scope of the present disclosure.

What is claimed is:

1. An array substrate comprising a plurality of thin film transistors (TFTs) and a plurality of recessed sections;
   wherein each recessed section is provided with at least one inclined surface, one of the TFTs is arranged at the inclined surface of each recessed section;
   the recessed sections are divided into at least two types; in the recessed sections of different types, angles between a horizontal surface of the array substrate and the inclined surfaces on which the TFTs are arranged are different from each other;
   an active layer of each TFT is a poly-Si film formed by subjecting an a-Si film to excimer laser annealing treatment.

2. The array substrate according to claim 1, further comprising a base substrate; wherein the plurality of recessed sections is formed in the base substrate, and the horizontal surface of the array substrate is a horizontal surface of the base substrate.

3. The array substrate according to claim 1, further comprising a base substrate and a buffer layer arranged on the base substrate; wherein the plurality of recessed sections is formed in the buffer layer, and the horizontal surface of the array substrate is a horizontal surface of the base substrate.

4. The array substrate according to claim 3, wherein the buffer layer is made of a photosensitive material.

5. The array substrate according to claim 1, wherein the recessed sections are divided into two types comprising first recessed sections and second recessed sections;
   an angle between the inclined surface of the first recessed section on which the TFT is arranged and the horizontal surface of the array substrate is greater than an angle between the inclined surface of the second recessed section on which the TFT is arranged and the horizontal surface of the array substrate; and
   the TFT arranged within the first recessed section is a driving TFT, and the TFT arranged within the second recessed section is a switching TFT.

6. The array substrate according to claim 1, wherein the angle between the horizontal surface of the array substrate and each of the inclined surfaces of the recessed sections on which the TFTs are arranged is greater than 0° and less than 80°.

7. The array substrate according to claim 1, wherein each recessed section is of a depth less than 50 μm.

8. A method for manufacturing an array substrate, comprising:
   forming a pattern comprising a plurality of recessed sections in a base substrate by a patterning process, each recessed section being provided with at least one inclined surface; and
   forming a pattern comprising a thin film transistor (TFT) on the inclined surface of each recessed section;
   wherein the recessed sections are divided into at least two types; in the recessed sections of different types, angles between a horizontal surface of the base substrate and the inclined surfaces on which the TFTs are arranged are different from each other.

9. The method according to claim 8, wherein the recessed sections are divided into two types comprising first recessed sections and second recessed sections; an angle between the inclined surface of the first recessed section on which the TFT is arranged and the horizontal surface of the base substrate is greater than an angle between the inclined surface of the second recessed section on which the TFT is arranged and the horizontal surface of the base substrate; and
   the step of forming the pattern comprising the TFT on the inclined surface of each recessed section comprises:
   forming a pattern comprising a driving TFT on the inclined surface of each first recessed section, and forming a pattern comprising a switching TFT on the inclined surface of each second recessed section.

10. The method according to claim 8, wherein the step of forming the pattern comprising the TFT on the inclined surface of each recessed section comprises forming an active layer of each TFT; and
    the step of forming the active layer of each TFT comprises:
    forming an a-Si film at each recessed section; and
    irradiating a laser beam from an excimer laser in a direction perpendicular to the horizontal surface of the base substrate onto the a-Si film at each recessed section to melt and crystallize the a-Si film into a poly-Si film.

11. The method according to claim 8, wherein the angle between the horizontal surface of the base substrate and each of the inclined surfaces of the recessed sections on which the TFTs are arranged is greater than 0° and less than 80°.

12. The method according to claim 8, wherein each recessed section is of a depth less than 50 μm.

13. A method for manufacturing an array substrate, comprising steps of:
    forming a buffer layer on a base substrate;
    forming a pattern comprising a plurality of recessed sections in the buffer layer by a patterning process, each recessed section being provided with at least one inclined surface; and
    forming a pattern comprising a thin film transistor (TFT) on the inclined surface of each recessed section;
    wherein the recessed sections are divided into at least two types; in the recessed sections of different types, angles between a horizontal surface of the base substrate and the inclined surfaces on which the TFTs are arranged are different from each other.

14. The method according to claim 13, wherein the recessed sections are divided into two types comprising first recessed sections and second recessed sections; an angle between the inclined surface of each first recessed section on which the TFT is arranged and the horizontal surface of the base substrate is greater than an angle between the inclined surface of each second recessed section on which the TFT is arranged and the horizontal surface of the base substrate; and the step of forming the pattern comprising the TFT on the inclined surface of each recessed section comprises:
forming a pattern comprising a driving TFT on the inclined surface of each first recessed section, and forming a pattern comprising a switching TFT on the inclined surface of each second recessed section.

15. The method according to claim 14, wherein the step of forming the pattern comprising a plurality of recessed sections in the buffer layer by a patterning process comprises:
exposing the buffer layer using a half-tone or gray-tone mask plate; and
developing the exposed buffer layer to form the pattern comprising a plurality of recessed sections.

16. The method according to claim 13, wherein the step of forming the pattern comprising a plurality of recessed sections in the buffer layer by a patterning process comprises:
exposing the buffer layer using a half-tone or gray-tone mask plate; and
developing the exposed buffer layer to form the pattern comprising a plurality of recessed sections.

17. The method according to claim 13, wherein the step of forming the pattern comprising the TFT on the inclined surface of each recessed section comprises forming an active layer of each TFT; and the step of forming the active layer of each TFT comprises:
forming an a-Si film at each recessed section; and
irradiating a laser beam from an excimer laser in a direction perpendicular to the horizontal surface of the base substrate onto the a-Si film at each recessed section to melt and crystallize the a-Si film into a poly-Si film.

18. The method according to claim 13, wherein the angle between the horizontal surface of the base substrate and each of the inclined surfaces of the recessed sections on which the TFTs are arranged is greater than 0° and less than 80°.

19. A display panel comprising the array substrate according to claim 1.

20. A display device comprising the display panel according to claim 19.

* * * * *